(12) United States Patent
Bader et al.

(10) Patent No.: US 7,709,851 B2
(45) Date of Patent: May 4, 2010

(54) LIGHT-EMITTING DIODE CHIP INCLUDING A MIRROR LAYER AND A LIGHT-GENERATING ACTIVE ZONE

(75) Inventors: Stefan Bader, Pentling (DE); Wolfgang Schmid, Deuerling/Hillohe (DE)

(73) Assignee: Osram Opto Semiconductors GmbH, Regensburg (DE)

( * ) Notice: Subject to any disclaimer, the term of this patent is extended or adjusted under 35 U.S.C. 154(b) by 194 days.

(21) Appl. No.: 11/578,657

(22) PCT Filed: Apr. 14, 2005

(86) PCT No.: PCT/DE2005/000677

§ 371 (c)(1),
(2), (4) Date: Jul. 23, 2007

(87) PCT Pub. No.: WO2005/101531

PCT Pub. Date: Oct. 27, 2005

(65) Prior Publication Data

US 2008/0142780 A1    Jun. 19, 2008

(30) Foreign Application Priority Data

Apr. 14, 2004 (DE) ........................ 10 2004 018 484
Apr. 11, 2005 (DE) ........................ 10 2005 016 592

(51) Int. Cl.
*H01L 29/22* (2006.01)
*H01L 29/227* (2006.01)
*H01L 33/00* (2006.01)
*H01L 27/15* (2006.01)
*H01L 29/267* (2006.01)
*H01L 31/12* (2006.01)
*H01L 29/16* (2006.01)
*H01L 29/06* (2006.01)
*H01L 31/0328* (2006.01)
*H01L 31/0336* (2006.01)
*H01L 31/072* (2006.01)
*H01L 31/109* (2006.01)
*H01L 31/0203* (2006.01)

(52) U.S. Cl. ............................ 257/98; 257/13; 257/81; 257/82; 257/99; 257/433; 257/434; 257/E33.001

(58) Field of Classification Search ................... 257/13, 257/81–82, 99, 433–434, 98, E33.001
See application file for complete search history.

(56) References Cited

U.S. PATENT DOCUMENTS 5,747,862 A * 5/1998 Kishino et al. .............. 257/436

(Continued)

FOREIGN PATENT DOCUMENTS

DE     19921987 A1     11/1999
DE     19963550 A1     7/2001

(Continued)

OTHER PUBLICATIONS

Shen, Y.S. et al., "Optical cavity effects in InGaN/GaN quantum-well-heterostructure flip-chip LEDs", Applied Physics Letters vol. 82, No. 14, pp. 2221-2223, 2003.

(Continued)

*Primary Examiner*—Ida M Soward
(74) *Attorney, Agent, or Firm*—Cohen Pontani Lieberman & Pavane LLP

(57) ABSTRACT

A thin-film light-emitting diode chip, in which the distance between a mirror layer (4) and a light-generating active zone (3) is set in such a way that a radiation emitted by the active zone (3) interferes with a light reflected from the mirror layer (4), the internal quantum efficiency of the active zone (3) being influenced by this interference and the emission characteristic of the active zone (3) of at least one preferred direction thereby being obtained.

17 Claims, 2 Drawing Sheets

U.S. PATENT DOCUMENTS

| | | | |
|---|---|---|---|
| 6,091,197 A * | 7/2000 | Sun et al. | 313/509 |
| 6,320,893 B1 * | 11/2001 | Ueki | 372/96 |
| 6,720,585 B1 * | 4/2004 | Wasserbauer et al. | 257/98 |
| 6,835,959 B2 * | 12/2004 | Ouchi | 257/79 |
| 6,878,563 B2 | 4/2005 | Bader et al. | |
| 6,897,488 B2 * | 5/2005 | Baur et al. | 257/95 |
| 6,927,387 B2 * | 8/2005 | Viktorovitch et al. | 250/226 |
| 6,936,859 B1 | 8/2005 | Uemura et al. | |
| 7,084,432 B2 * | 8/2006 | Kachi et al. | 257/81 |
| 7,126,750 B2 * | 10/2006 | Wasserbauer | 359/344 |
| 7,129,527 B2 * | 10/2006 | Yang | 257/98 |
| 7,257,141 B2 * | 8/2007 | Chua | 372/46.013 |
| 7,375,377 B2 * | 5/2008 | Baur et al. | 257/79 |
| 2001/0028062 A1 * | 10/2001 | Uemura et al. | 257/79 |
| 2003/0143772 A1 | 7/2003 | Chen | |
| 2004/0016937 A1 | 1/2004 | Kachi et al. | |
| 2004/0026703 A1 | 2/2004 | Adomi et al. | |
| 2004/0061101 A1 | 4/2004 | Noto et al. | |
| 2004/0161008 A1 * | 8/2004 | Behringer et al. | 372/45 |
| 2005/0059179 A1 * | 3/2005 | Erchak et al. | 438/22 |
| 2006/0119250 A1 * | 6/2006 | Suehiro et al. | 313/498 |
| 2007/0228943 A1 * | 10/2007 | Yamada et al. | 313/504 |
| 2009/0014742 A1 * | 1/2009 | Erchak | 257/98 |

FOREIGN PATENT DOCUMENTS

| | | |
|---|---|---|
| DE | 10026255 A1 | 11/2001 |
| DE | 10246891 A1 | 4/2003 |
| DE | 10324645 A1 | 2/2004 |
| EP | 0810674 A2 | 12/1997 |
| EP | 0977277 A | 2/2000 |
| EP | 1406315 A | 4/2004 |

OTHER PUBLICATIONS

H. Benisty et al., "Impact of Planar Microcavity Effects on Light Extraction - Part I: Basic Concepts and Analytical Trends", IEEE Journal of Quantum Electronics, vol. 34, No. 9, pp. 1612-1631, Sept. 1998.

H. Benisty et al., "Impact of Planar Microcavity Effects on Light Extraction - Part II: Selected Exact Simulations and Role of Photon Recycling", IEEE Journal of Quantum Electronics, vol. 34, No. 9, pp. 1632-1643, Sept. 1998.

H. De Neve et al., "Resonant Cavity LED's, Design, fabrication and analysis of high efficiency LED's", J. Rarity and C. Weisbuch (eds.) Microcavities and Photonic Bandgaps, pp. 333-342.

R. Wirth et al., "High Efficiency Resonant-Cavity LEDs Emitting at 650 nm", IEEE Photonics Technology Letters, vol. 13, No. 5, pp. 421-423, May 2001.

I. Schnitzer et al., "30% external quantum efficiency from surface textured, thin-film light-emitting diodes", Applied Physics Letters vol. 63, No. 16, pp. 2174-2176, Oct. 18, 1993.

* cited by examiner

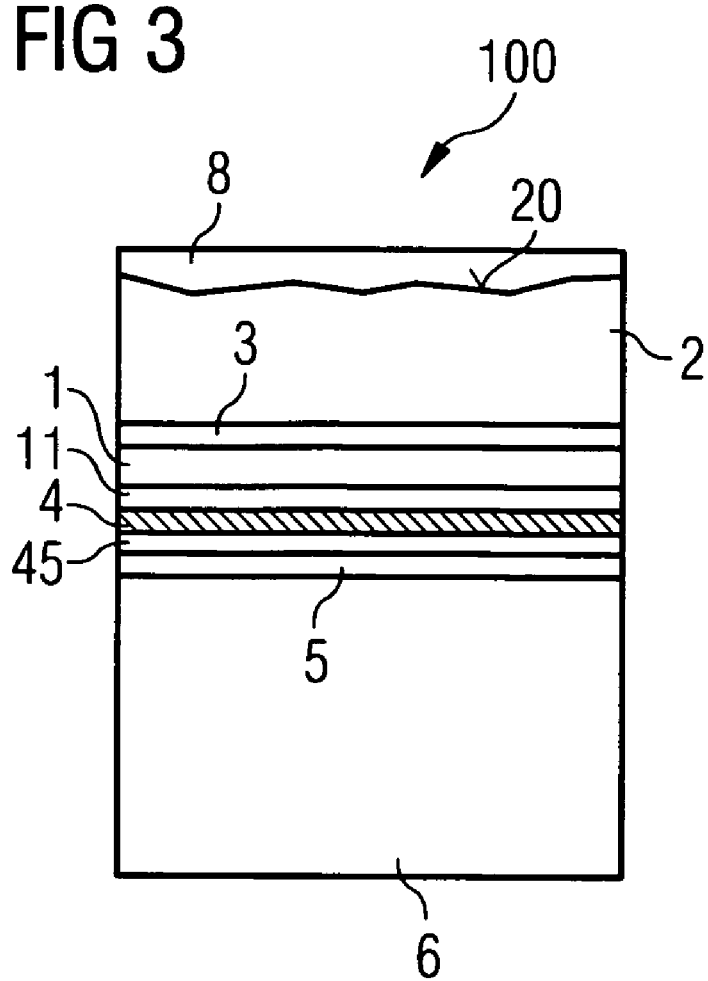
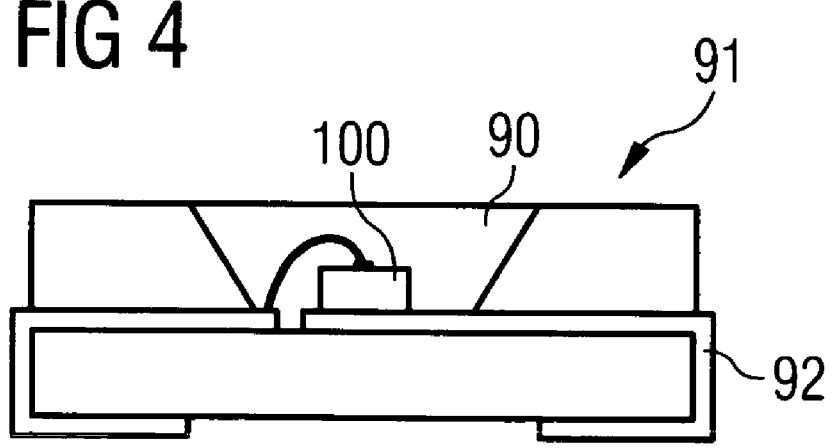

LIGHT-EMITTING DIODE CHIP INCLUDING A MIRROR LAYER AND A LIGHT-GENERATING ACTIVE ZONE

RELATED APPLICATIONS

This is a U.S. national stage of application No. PCT/DE05/000677, filed on 14 Apr. 2005.

This patent application claims priority of German patent application No. 102004 018 484.4, filed 14 Apr. 2004 and German patent application No. 10 2005 016 592.3, filed 11 Apr. 2005, the disclosure content of which is hereby incorporated by reference.

FIELD OF THE INVENTION

The invention relates to a light-emitting diode chip, in particular a thin-film light-emitting diode chip.

BACKGROUND OF THE INVENTION

The document Y. C. Shen et al "Optical cavity effects in InGaN/GaN quantum-well-heterostructure flip-chip light-emitting diodes", Appl. Phys. Lett. Vol. 82 No. 14., p. 2221 discloses a GaN-based FCLED chip (light-emitting diode chip in a flip-chip arrangement). A sapphire substrate serves as a coupling-out layer in this case.

The document US 2003/0143772 A1 discloses a thin-film LED chip with an AlGaInN epitaxial structure without a growth substrate.

SUMMARY OF THE INVENTION

It is an object of the present invention to specify a thin-film light-emitting diode chip having a high efficiency and low absorption losses.

A thin-film light-emitting diode chip is specified in which the distance between a mirror layer and a light-generating active zone is set in such a way that a radiation emitted by the active zone interferes with a light reflected from the mirror layer. As a result of this interference, the internal quantum efficiency of the active zone is influenced and a direction-dependent emission characteristic of the active zone is obtained. The direction-dependent emission characteristic has at least one preferred direction. The thin-film light-emitting diode chip has a coupling-out layer which is at least semiconducting. In this case, the coupling-out layer is not an antireflection coating layer.

A thin-film light-emitting diode chip is distinguished in particular by the following characteristic features:
- a reflective layer is applied or formed at a first main area of a radiation-generating epitaxial layer sequence facing toward a carrier element, said reflective layer reflecting at least part of the electromagnetic radiation generated in the epitaxial layer sequence back into the latter;
- the epitaxial layer sequence has a thickness in the region of 20 µm or less, in particular in the range of between 4 µm and 10 µm; and
- the epitaxial layer sequence contains at least one semiconductor layer with at least one area which has an intermixing structure which ideally leads to an approximately ergodic distribution of the light in the epitaxial layer sequence, that is to say that it has an as far as possible ergodically stochastic scattering behavior.

A thin-film light-emitting diode chip is to a good approximation a Lambert surface radiator. The basic principle of a thin-film light-emitting diode chip is described for example in the document I. Schnitzer et al., Appl. Phys. Lett. 63 (16), Oct. 18, 1993, 2174-2176.

In the present case a thin-film LED chip is understood to be, in particular, a light-emitting diode chip having a layer construction with epitaxially grown layers from which the growth substrate has preferably been removed after growth. At least some of the epitaxially grown layers are semiconductor layers. The chip may have a carrier which is different than the growth substrate and on which the layer construction is applied.

The thin-film LED chip specified does not have a resonator. The thin-film LED chip specified comprises only a single mirror, in contrast to an RCLED (Resonant Cavity Light-Emitting Diode). In contrast to an RCLED, the thin-film LED chip, and in particular the epitaxial layer construction, advantageously does not comprise a Bragg mirror.

In one preferred variant, the thin-film light-emitting diode chip is GaN-based. In contrast to GaN-based flip-chip LEDs on sapphire substrates, the light generated in the semiconductor body is coupled out from the semiconductor body directly, that is to say without absorption losses and reflection losses on account of a substrate arranged downstream of the radiation-emitting epitaxial layer sequence.

Optical near field effects influence the coupling-out efficiency to a great extent in the case of thin-film LEDs. The advantage of the application of optical near field effects resides in the increase in the proportion of radiation that is coupled out from the light-generating semiconductor. The thin-film chip specified here is distinguished by a high coupling-out efficiency that can exceed 70%.

The active zone generally has a plurality of partial layers, for example in the form of a single quantum well or a multiple quantum well structure.

The semiconductor body has at least one first semiconductor layer of a first conduction type, at least one second semiconductor layer of a second conduction type and the active zone arranged in between. The first semiconductor layer is preferably p-doped, and the second semiconductor layer is preferably n-doped. The semiconductor layers are preferably transparent, that is to say transmissive to the radiation generated in the active zone.

The semiconductor body may contain a barrier layer, for example, which is arranged between the first semiconductor layer and the mirror layer and acts e.g. as a charge carrier diffusion barrier, that is to say prevents charge carriers from emerging from the first semiconductor layer in the direction of the mirror layer. The charge carrier barrier layer is preferably at least partly semiconducting and may contain Al in one variant. The charge carrier barrier layer is preferably transparent to the radiation generated in the active zone.

The semiconductor body is preferably identical with the epitaxially grown layer construction of the chip. The layers of the semiconductor body are grown on a growth substrate present as a wafer. Firstly, preferably the n-doped second semiconductor layer is deposited epitaxially. Furthermore, the active zone or partial layers of the active zone, the p-doped first semiconductor layer and, if appropriate, a charge carrier barrier layer are epitaxially grown successively. The mirror layer is then preferably applied by sputtering or vapor deposition.

The mirror layer is preferably a metal layer. The mirror layer is preferably highly reflective in broadband fashion, the mirror layer reflecting e.g. at least 70%, preferably at least 80%, of the incident light. The mirror layer is produced e.g. from Ag, Au, Pt or Al and/or from an alloy of at least two of said metals. The mirror layer may also be formed by a multilayer sequence having a plurality of layers made of different metals or alloys from among those mentioned above.

The layer composite comprising the epitaxial layer sequence, the growth substrate and the mirror layer is preferably fixedly connected by eutectic bonding to a carrier which can be optimized with regard to electrical and/or thermal properties and regarding the optical properties of which no requirements are imposed. The carrier is preferably electrically conductive or at least semiconducting. By way of example, germanium, GaAs, SiC, AlN or Si are suitable as carrier material. A carrier surface facing the mirror layer is preferably planar. The growth substrate is stripped away from the semiconductor body after the layer composite has been connected to the carrier.

At least one adhesion promoting layer may be provided between the mirror layer and the carrier. The preferably electrically conductive adhesion promoting layer connects the carrier to the epitaxial layer sequence, the mirror layer facing the carrier. The adhesion promoting layer may be, in particular, a metal layer made e.g. of PbSn (solder), AuGe, AuBe, AuSi, Sn, In or PdIn. The mirror layer may be protected by a diffusion barrier layer facing the adhesion promoting layer and comprising e.g. Ti and/or W. A diffusion barrier layer prevents the penetration of material from the adhesion promoting layer into the mirror layer.

All the layers of the light-emitting diode chip mentioned here, in particular the active zone and the semiconductor layers of the semiconductor body, may in each case comprise a plurality of partial layers.

The semiconductor body comprises a coupling-out layer with a coupling-out area. The radiation distribution in the coupling-out layer has preferred directions. The term "preferred directions" means that the emission characteristic deviates from the Lambert emission characteristic, which is a homogenous emission characteristic. The preferred directions are meant to be directions where the radiated intensity is high compared to adjacent directions. Hence the emission characteristic has alternately arranged regions having a high intensity and a low intensity. The preferred directions result from interference effects as radiation generated by the light source and radiation reflected by the mirror layer interfere. Constructive interference results in emission lobes with high intensity. The direction of each such emission lobe represents one preferred direction. The coupling-out layer is preferably identical with the second semiconductor layer, which is e.g. n-doped. The first semiconductor layer, which is e.g. p-doped, is preferably arranged between the mirror layer and the active zone.

The mirror layer is arranged so close to the light source, i.e. the active zone, that optical near field effects are manifested to a significant extent in the event of the interference. The interference of the generated and reflected light waves influences the spontaneous emission in the active zone, in particular the lifetime of the radiative recombination and hence the internal quantum efficiency in the light-generating layer. Specific mirror distances (e.g. $\lambda/4$, $3\lambda/4$, $5\lambda/4$) with respect to the active layer which generate a favorable (angle-dependent) emission characteristic are accompanied by an increase in the internal quantum efficiency. The emission characteristic is considered favorable if it has preferred directions, i.e. if the emission characteristic deviates from the homogenous Lambert characteristic.

The distance between the mirror and the light source is e.g. a maximum of $2\lambda$, where $\lambda=\mu_0/n$ is the light wavelength in the optical medium (here semiconductor body) and $\lambda 0$ is the light wavelength in a vacuum. The distance between the light-generating layer and the mirror layer is less than $1.75\lambda$ in one variant. In a further advantageous variant, said distance is less than $1.5\lambda$. The small distance has the advantage that the spontaneous emission of the active zone is controlled by the interaction of the radiation generated in the active zone and the radiation reflected by the mirror.

The radiation generated by the light source and the radiation reflected by the mirror can interfere constructively in the case of specific distances between the light source and the mirror. By way of example, in the case of a radiation that is incident perpendicularly on the interface of an optical medium, maxima of the radiation distribution occur if the distance between the light source and the mirror is $(2m+1)\lambda/4n$, where n is the refractive index of the optical medium and m=0, 1, 2 . . . specifies the coupling-out order. In the case of zeroth-order coupling-out, all of the photons are emitted in a cone whose axis of rotational symmetry is substantially perpendicular to the coupling-out interface. In the case of first-order coupling-out there exists an additional emission lobe at a greater angle with respect to the normal to the coupling-out area. m additional emission lobes of this type exist in the case of m-th-order coupling-out.

The setting of a distance between the light-generating layer and the mirror layer which is essentially $(2m+1)\lambda/4$ results in a directional emission of the active zone whose emission characteristic deviates from the Lambert emission characteristic and which has alternately arranged regions having a high intensity and a low intensity. The distance between the mirror and the light-generating layer may be chosen, and the emission characteristic within the semiconductor may thus also be set, such that a high proportion of radiation is already within the critical angle of total reflection upon first impinging on the light-coupling-out interface. The higher the order (i.e. m) is, the more lobes are obtained. As a result, the distance between the lobes decreases which causes a smearing of the desired effect of obtaining an emission characteristic with preferred directions. Hence lower orders, in particular m=0, 1, and 2 are preferred.

The distance between the mirror layer and the active zone, in different variants, is e.g.

1) $0.16\lambda$ to $0.28\lambda$, that is to say approximately $\lambda/4$; the radiation distribution has a preferred direction that is perpendicular to the coupling-out area;

2) $0.63\lambda$ and $0.78\lambda$, that is to say approximately $3\lambda/4$; the radiation distribution has two preferred directions, to be precise one perpendicular to the coupling-out area and one oblique thereto;

3) $1.15\lambda$ and $1.38\lambda$, that is to say approximately $5\lambda/4$; the radiation distribution has three preferred directions, one perpendicular to the coupling-out area and two oblique thereto.

The wavelength of the coupled-out radiation may be in the infrared range, visible range or ultraviolet range.

The semiconductor body may be produced on the basis of different semiconductor material systems depending on wavelength. For example a semiconductor body based on $In_xGa_yAl_{1-x-y}As$ is suitable for a long-wave radiation, for example a semiconductor body based on $In_xGa_yAl_{1-x-y}P$ is suitable for visible red to yellow radiation, and e.g. a semiconductor body based on $In_xGa_yAl_{1-x-y}N$ is suitable for short-wave visible (green to blue) or UV radiation, where $0 \leq x \leq 1$ and $0 \leq y \leq 1$ hold true. The spectral width of the emerging radiation may be e.g. 15 to 40 nm. However, the spectral full width at half maximum of the generated radiation is not restricted to the specified range.

The distance between the light-generating layer and the mirror layer is preferably identical with the layer thickness of the p-type layer.

In one variant, the second semiconductor layer may have a planar coupling-out area. In this case, the emission characteristic of the light emerging from the chip deviates from the Lambert emission characteristic and has a high radiation density in at least one preferred direction and a low radiation density in other angular ranges.

In a further variant, the coupling-out area of the second semiconductor layer may be roughened in such a way that the radiation which is not coupled out upon impinging on this interface is backscattered into the semiconductor in different directions. By virtue of this redistribution of the radiation directions, a so-called waveguide effect is avoided, and the coupling-out efficiency is thus increased. The emission characteristic of the radiation emerging from the chip is essentially a Lambert characteristic in this case.

The second semiconductor layer may be arranged between the active zone and an antireflection coating layer, the thickness of which is approximately equal to a quarter wavelength. The antireflection coating layer is preferably a dielectric layer that is applied to the coupling-out area of the semiconductor body after the removal of the growth substrate.

The light-emitting diode chip is preferably arranged in an optical component in a depression of a housing, in which case the depression may have a reflective surface. The light-emitting diode chip may be encapsulated with an encapsulant in said depression. The coupling-out efficiency of the optical component may be increased by the use of resins having a high refractive index with a refractive index n>1.55, e.g. epoxy resin or silicone resin, for encapsulating the thin-film chip.

BRIEF DESCRIPTION OF THE DRAWINGS

The invention is explained in more detail below on the basis of exemplary embodiments and the associated figures. The figures show different exemplary embodiments of the invention on the basis of schematic illustrations that are not true to scale. Identical or identically acting parts are designated by the same reference symbols.

FIG. 3 schematically shows a thin-film LED chip with a roughened coupling-out area;

FIG. 4 schematically shows an optical component with an LED chip.

DETAILED DESCRIPTION OF THE DRAWINGS

Figure 1:
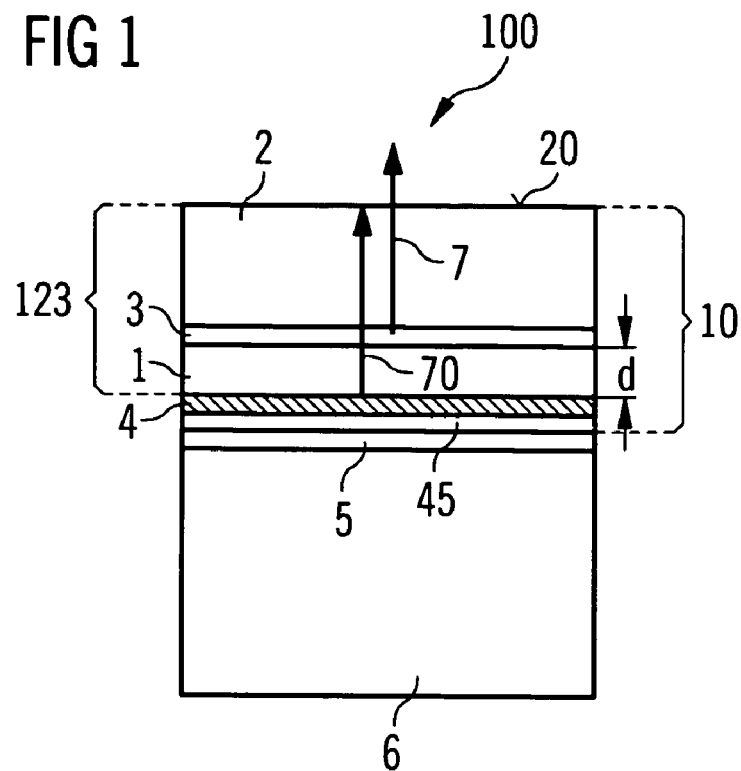
FIG. 1 schematically shows an exemplary thin-film LED chip with a planar coupling-out area.

FIG. 1 schematically shows a detail from an exemplary thin-film LED chip 100 having a carrier 6 and a multilayer construction 10. An adhesion promoting layer 5 is arranged between carrier 6 and multilayer construction 10. The multilayer construction 10 comprises a light-emitting active zone 3 arranged between a p-conducting first semiconductor layer 1 and an n-conducting second semiconductor layer 2. The first semiconductor layer 1 is arranged between the active zone 3 and a metallic mirror layer 4. The electrically conductive mirror layer 4 functions both as a mirror and as an electrical contact layer to the first semiconductor layer. The mirror layer 4 is protected by a diffusion barrier layer 45 arranged between the mirror layer 4 and the adhesion promoting layer 5. The first and second semiconductor layers 1 and 2 and the active zone 3 together form a semiconductor body 123. The latter together with the diffusion barrier layer 45 and the mirror layer 4 forms the multilayer construction 10.

In a method for producing such a thin-film LED chip, the second semiconductor layer 2, the active zone 3 and the first semiconductor layer 1 are epitaxially produced successively on a growth substrate (not shown here). The mirror layer 4 is applied to this epitaxial layer construction e.g. by sputtering or vapor deposition. The multilayer construction 10 is connected to the carrier 6, which e.g. comprises Ge or a substantial part of which has Ge, by means of the adhesion promoting layer 5. The growth substrate is then removed. After the removal of said substrate, the second semiconductor layer 2 facing the growth substrate forms a coupling-out layer and that surface of said coupling-out layer which is remote from the active zone 3 forms a coupling-out area 20, which is planar in this exemplary embodiment.

The direction of propagation of the radiation generated in the active zone 3 and of the radiation reflected from the mirror layer 4 is indicated by the arrows 7 and 70, respectively, in FIG. 1. The light generated by the interference of the two radiation components 7 and 70 emerges from the multilayer construction 10 in a direction facing away from the carrier 6.

The distance between the mirror layer 4 and the active zone 3, which in this variant is equal to the thickness of the first semiconductor layer 1, is set in such a way that the radiation emitted by the active zone 3 interferes with a radiation reflected from the mirror layer 4, and that the lifetime for radiative recombination in the active zone 3 is influenced by this interference. The interference produces the emission lobes. Hence, one can see from the angle-dependent radiation characteristic whether there are lobes or not. A person skilled in the art knows how to measure the radiation characteristic. The lifetime affects the internal quantum efficiency. An increase of the internal quantum efficiency, in turn, results in higher output power. Therefore, the simplest way to study the effect of the interference on the lifetime is to measure the output power. A person skilled in the art knows how to measure the output power and also knows how to measure the lifetime using various methods.

The near field effects utilized in the thin-film LED chip specified are comparable to a cavity effect, that is to say to the wave effects occurring in an optical resonator (resonant cavity). By virtue of these effects, it is possible within the light-generating semiconductor to set its emission characteristic such that a large portion of the photons impinges on the coupling-out interface at an angle below the angle of total reflection. As a result, a largest possible portion of the radiation is coupled out from the chip upon first impinging on the coupling-out interface (=coupling-out area 20). Only a small portion is reflected back into the semiconductor 1, 2, 3. This portion of the light experiences losses upon reflection at the mirror layer 4 and also due to reabsorption in the active zone 3, the quantum efficiency of which is only approximately 50%, before it impinges on the coupling-out interface again. The recycling rate is thus significantly reduced by the application of the cavity effect in the thin-film LED chip. The recycling rate is a measure of how many photons are absorbed in the LED and re-emitted. Because only a small portion of the radiation is reflected back, the fraction of photons being absorbed is comparably low. Therefore, the recycling rate is low, too.

A further advantage of the application of the cavity effect in thin-film LEDs consists in the influencing of the emission characteristic outside the semiconductor. Depending on the angular distribution of the photons within the semiconductor as a function of the distance between the mirror and the light-generating layer, it is possible—in the case of a non-roughened coupling-out area—to vary the emission characteristic outside the semiconductor and in particular to obtain a radiation distribution with preferred directions.

Preferred values for the distance d between the light-generating layer and the mirror layer are—for the radiation having the wavelength $\lambda 0=455$ nm (corresponds to the wavelength $\lambda=182$ nm in the semiconductor having a refractive index n=2.5)—approximately d=40 nm for zeroth-order coupling-out, d=130 nm for first-order coupling-out, and d=230 nm for second-order coupling-out.

These values correspond to $d=0.22\lambda$ for the zeroth order, $d=0.71\lambda$ for the first order, and $d=1.26\lambda$ for the second order. d must be correspondingly scaled for other wavelengths.

The lower the coupling-out order, the higher the efficiency of the thin-film LED chip. If a change is made for example from second-order coupling-out to first-order coupling-out, this results in an increase in efficiency by approximately 25%. Therefore, zeroth-order coupling-out is set in one preferred variant.

An expedient concrete construction of a thin-film LED chip based on GaN has the following layer sequence:
front side contact metallization,
highly doped GaN:Si (layer thickness: 700-1500 nm)
somewhat more lightly doped GaN:Si (layer thickness: 4000 nm)
undoped GaN (layer thickness: 30 nm)
InGaN quantum well (layer thickness: approximately 1 nm; In content approximately 10%)
barrier layer (approximately 5 nm undoped GaN+6-7 nm Si-doped GaN+approximately 5 nm undoped GaN)
InGaN quantum well as above
barrier layer as above
InGaN quantum well as above
barrier layer as above
InGaN quantum well (layer thickness approximately 2-3 nm, In content approximately 20%)
undoped GaN layer (layer thickness approximately 5-10 nm)
p-doped AlGaN layer (layer thickness 20-40 nm; electron barrier layer; Al content 10-25%)
p-doped GaN:Mg (terminating layer)
mirror (Pt layer not closed+Ag layer+diffusion barrier+ optionally further layers+connecting layer)
Ge carrier In the case of the second exemplary embodiment in accordance with FIG. 2, in contrast to the exemplary embodiment in accordance with FIG. 1, at least one further, preferably a thin charge carrier barrier layer 11 is arranged between the active zone 3 and the semiconductor layer facing the mirror layer 4 (i.e. the first semiconductor layer 1). The charge carrier barrier layer 11 is preferably part of the semiconductor body and therefore grown epitaxially and semiconducting.

Figure 2:
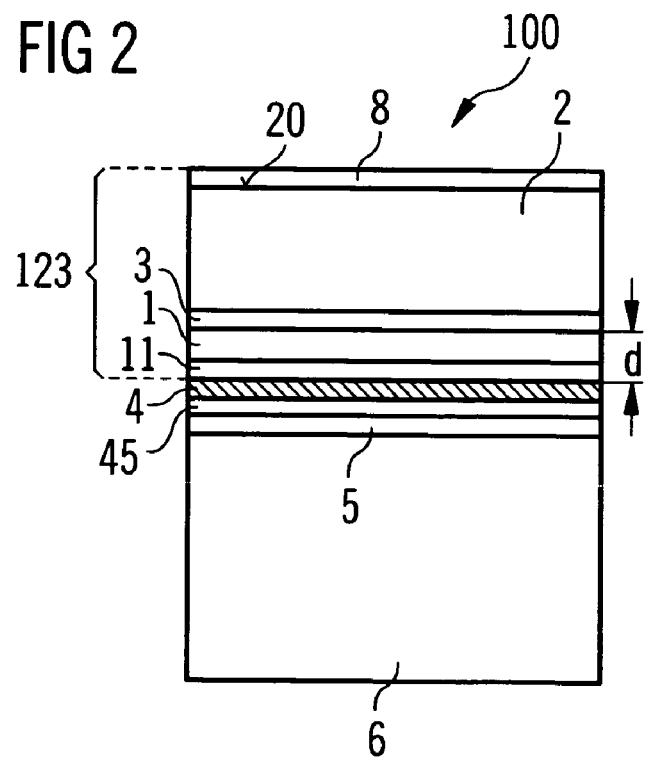
FIG. 2 schematically shows a thin-film LED chip with a semiconductor body comprising a barrier layer and with an antireflection coating layer.

In the case of the exemplary embodiment in accordance with FIG. 2, a passivation layer 8 is furthermore provided on the second semiconductor layer 2, said passivation layer being formed as an antireflection coating layer in an expedient configuration by setting a certain thickness. Such a layer may be applied e.g. by deposition after the removal of the growth substrate. The antireflection coating layer 8 is not produced epitaxially and comprises silicon oxide or silicon nitride, for example.

In contrast to the exemplary embodiment in accordance with FIG. 2, the exemplary embodiment of a thin-film LED chip in accordance with FIG. 3 has a roughened coupling-out area 20. The gain obtained by utilizing cavity effects is thereby only slightly diminished. Because of the emission lobes, the emission characteristic exhibits preferred directions. The angle of the axis of each emission lobe depends on the distance between the active layer and the mirror layer. As a result, the angle of the axis changes if there are undesired deviations of this distance due to fluctuations. The roughened surface may decrease the intensity of the lobes, i.e. the difference in intensity between high intensity regions and low intensity regions. Therefore, the emission characteristic changes less in case of a roughened surface. An emission characteristic which is only slightly influenced by fluctuations in the distance between the active layer and the mirror proves to be advantageous.

FIG. 4 shows an optical component comprising a housed light-emitting diode chip 100 e.g. in accordance with exemplary embodiments presented in FIGS. 1 to 3. The light-emitting diode chip 100 is mounted on a leadframe 92 and installed in a depression of the housing 91. The depression of the housing 91 preferably has a light-reflecting surface. The light-emitting diode chip is encapsulated with an encapsulant 90.

The scope of protection of the invention is not limited to the examples given hereinabove. The invention is embodied in each novel characteristic and each combination of characteristics, which includes every combination of any features which are stated in the claims, even if this combination of features is not explicitly stated in the claims.

The invention claimed is:

1. A thin-film light-emitting diode chip, comprising:
a mirror layer;
a light generating active zone configured for generating light at a wavelength $\lambda$; and
a semiconducting radiation coupling-out area,
wherein the light-generating active zone is arranged between the mirror layer and the semiconductor radiation coupling-out area, and
wherein the distance between said mirror layer and said light-generating active zone is one of between $0.16\lambda$ and $0.28\lambda$, and between $0.63\lambda$ and $0.78\lambda$, and between $1.15\lambda$ and $1.38\lambda$.

2. The thin-film light-emitting diode chip as claimed in claim 1, wherein the distance between the mirror layer and the active zone is less than $2\lambda$.

3. The thin-film light-emitting diode chip as claimed in claim 1, wherein the semiconductor body comprises GaN or GaN compounds.

4. The thin-film light-emitting diode chip as claimed in claim 1, wherein the mirror layer effects broadband reflection.

5. The thin-film light-emitting diode chip as claimed in claim 4, wherein the mirror layer comprises a metal layer.

6. The thin-film light-emitting diode chip as claimed in claim 1, further comprising a carrier facing the mirror layer, wherein said carrier is not a growth substrate for the semiconductor body.

7. The thin-film light-emitting diode chip as claimed in claim 6, further comprising at least one adhesion promoting layer disposed between the mirror layer and the carrier.

8. The thin-film light-emitting diode chip as claimed in claim 6, wherein the carrier is electrically conductive and the first semiconductor layer is contact-connected by means of said carrier.

9. The thin-film light-emitting diode chip as claimed in claim 1, further comprising a semiconductor body comprising the active zone and the coupling-out layer.

10. The thin-film light-emitting diode chip as claimed in claim 9, wherein the semiconductor body comprises a planar coupling-out area.

11. The thin-film light-emitting diode chip as claimed in claim 9, wherein the semiconductor body comprises a roughened coupling-out area.

12. The thin-film light-emitting diode chip as claimed in claim 9, wherein the light-emitting diode chip does not comprise a resonator.

13. The thin-film light-emitting diode chip as claimed in claim 12, wherein the second semiconductor layer is arranged between the active zone and an antireflection coating layer.

14. The thin-film light-emitting diode chip as claimed in claim 9, wherein the active zone is arranged between a first semiconductor layer of a first conductivity type and a second semiconductor layer of a second conductivity type, the second semiconductor layer forms a coupling-out layer, and the first semiconductor layer is arranged between the mirror layer and the active zone.

15. The thin-film light-emitting diode chip as claimed in claim 14, wherein the distance between the mirror layer and the active zone is equal to the thickness of the first semiconductor layer.

16. A thin-film light-emitting diode chip, comprising:
a mirror layer;
a light generating active zone configured for generating light at a wavelength $\lambda$; and
a semiconducting radiation coupling-out area,
wherein the light-generating active zone is arranged between the mirror layer and the semiconductor radiation coupling-out area, and
wherein the distance between said mirror layer and said light-generating active zone is one of between $0.16\lambda$ and $0.28\lambda$, and between $0.63\lambda$ and $0.78\lambda$, and between $1.15\lambda$ and $1.38\lambda$, and wherein the wavelength $\lambda$ is in one of the infrared range, visible range and ultraviolet range.

17. A thin-film light-emitting diode chip, comprising:
a mirror layer;
a light generating active zone configured for generating light at a wavelength $\lambda$; and
a semiconducting radiation coupling-out area,
wherein the light-generating active zone is arranged between the mirror layer and the semiconductor radiation coupling-out area, and
wherein the distance between said mirror layer and said light-generating active zone is one of between $0.16\lambda$ and $0.28\lambda$, and between $0.63\lambda$ and $0.78\lambda$, and between $1.15\lambda$ and $1.38\lambda$, and wherein the distance between said mirror layer and said light-generating active zone is constant for the length of a side of said mirror layer facing said light-generating active zone.

* * * * *